(12) United States Patent
Kim et al.

(10) Patent No.: US 9,086,575 B2
(45) Date of Patent: Jul. 21, 2015

(54) STEREOSCOPIC IMAGE DISPLAY DEVICE AND METHOD

(75) Inventors: Jinyeong Kim, Paju-si (KR); Sungpil Ryu, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 13/531,756

(22) Filed: Jun. 25, 2012

(65) Prior Publication Data

US 2013/0033750 A1    Feb. 7, 2013

(30) Foreign Application Priority Data

Aug. 5, 2011 (KR) .................. 10-2011-0078016

(51) Int. Cl.
| | |
|---|---|
| G02B 27/22 | (2006.01) |
| G02B 27/26 | (2006.01) |
| G02F 1/1335 | (2006.01) |
| G02F 1/13363 | (2006.01) |
| H04N 13/04 | (2006.01) |

(52) U.S. Cl.
CPC ............ *G02B 27/26* (2013.01); *G02F 1/13363* (2013.01); *G02F 1/133512* (2013.01); *G02F 1/133528* (2013.01); *H04N 13/0434* (2013.01); *G02F 2001/133538* (2013.01); *G02F 2001/133631* (2013.01)

(58) Field of Classification Search
None
See application file for complete search history.

(56) References Cited

U.S. PATENT DOCUMENTS

2010/0265433 A1* 10/2010 Hoshi .................. 349/62

OTHER PUBLICATIONS

Office Action dated Aug. 13, 2014, issued by the State Intellectual Property Office of China in Chinese Patent Application No. 20121027870.5.
Kang et al., "3.1: A Novel Polarizer Glasses-type 3D Displays with a Patterned Retarder," LG Display Co., Ltd., SID Symposium Digest of Technical Papers, vol. 41, Issue.1, May 2010.

* cited by examiner

*Primary Examiner* — Jade R Chwasz
(74) *Attorney, Agent, or Firm* — Morgan, Lewis & Bockius LLP

(57) ABSTRACT

A stereoscopic image display and method is provided. The stereoscopic image display device includes: a thin film transistor array substrate, a color filter substrate facing the thin film transistor array substrate, the color filter substrate including a plurality of black matrices, a plurality of black stripes on the color filter substrate, each of the plurality of black stripes corresponding to the black matrices, and a patterned retarder film on the color filter array substrate over the black stripes, wherein at least one of the plurality of black stripes includes a first black pattern and a second black pattern that are spaced apart from each other, such that gaps are disposed therebetween.

16 Claims, 9 Drawing Sheets

STEREOSCOPIC IMAGE DISPLAY DEVICE AND METHOD

CROSS-REFERENCE TO RELATED APPLICATION(S)

This application claims the benefit under 35 U.S.C. §119 (a) of Korean Patent Application No. 10-2011-0078016, filed on Aug. 5, 2011, in the Korean Intellectual Property Office, the entire disclosure of which is incorporated by reference herein for all purposes.

BACKGROUND

1. Field

The following description relates to a stereoscopic image display device and method, and more particularly, to a stereoscopic image display device and method which can improve the vertical viewing angle of a stereoscopic image and cancel front crosstalk.

2. Discussion of the Related Art

A stereoscopic image display displays a stereoscopic image using a stereoscopic technique or an autostereoscopic technique.

The stereoscopic technique, which uses a binocular parallax image between left and right eyes of a user and has a high stereoscopic effect, includes a glass method and a non-glass method which have been put to practical use. In the glass method, the binocular parallax image is displayed on a direct view-based display device or a projector by changing a polarization direction or in a time division manner, and polarization glasses or liquid crystal shutter glasses are used to implement stereoscopic images. In the non-glass method, generally, an optical plate such as a parallax barrier or the like for separating an optical axis of the binocular parallax image is provided at the front surface or rear surface of a display screen.

Figure 1:
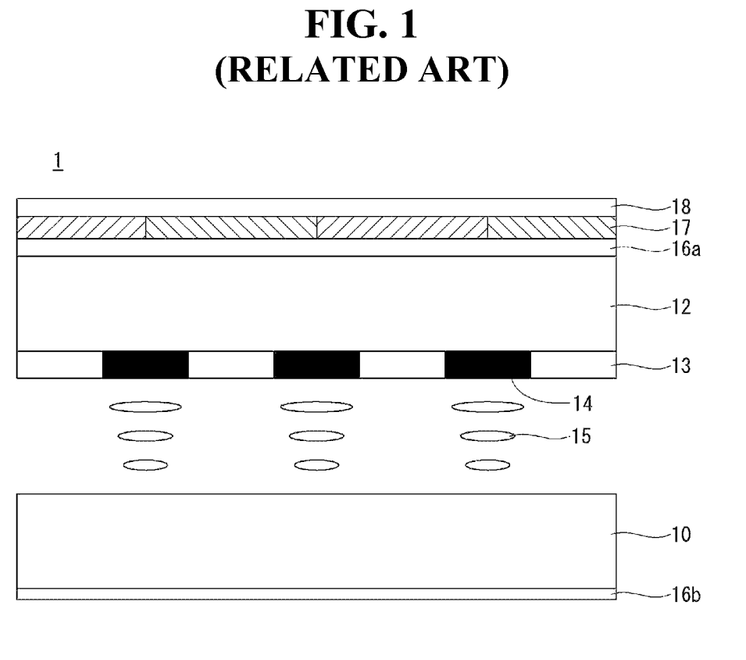
FIG. 1 is an example side exploded view showing a related art stereoscopic image display device.

FIG. 1 is an example exploded view showing a related art stereoscopic image display device.

With reference to FIG. 1, the glasses type stereoscopic image display device 1 comprises a thin film transistor array substrate 10, a color filter substrate 12 comprising color filters 13 and a black matrix 14, and a liquid crystal layer 15 interposed between the thin film transistor array substrate 10 and the color filter substrate 12. Upper and lower polarizations 16a and 16b are positioned on the thin film transistor array substrate 10 and the color filter substrate 12, a patterned retarder 17 is positioned on the upper polarization 16a, and a surface-treated protective film 18 is positioned on the patterned retarder 17.

The thus-configured stereoscopic image display device 1 alternately displays a left image and a right image and switches polarization characteristics incident to polarization glasses via the patterned retarder 17. Thereby, the glasses type can implement stereoscopic images by spatially dividing left images and right images.

When displaying a stereoscopic image, the stereoscopic image display device determines vertical viewing angle by the width of the black matrix, the distance between the color filters and the patterned retarder, etc. The related art stereoscopic image display device realizes a vertical viewing angle of 26 degrees by increasing the width of the black matrix, but the increase in the width of the black matrix leads to a decrease in aperture ratio and brightness.

SUMMARY

Embodiments of the present invention relate to a stereoscopic image display device and method.

An object of embodiments is to provide a stereoscopic image display device which can improve the vertical viewing angle of a stereoscopic image and cancel front crosstalk.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to an aspect of the present invention, a stereoscopic image display device includes a thin film transistor array substrate, a color filter substrate facing the thin film transistor array substrate, the color filter substrate including a plurality of black matrices, a plurality of black stripes on the color filter substrate, each of the plurality of black stripes corresponding to the black matrices, and a patterned retarder film on the color filter array substrate over the black stripes, wherein at least one of the plurality of black stripes includes a first black pattern and a second black pattern that are spaced apart from each other, such that gaps are disposed therebetween.

According to another aspect, a method of manufacturing a stereoscopic image display device includes forming a thin film transistor array substrate, forming a color filter substrate facing the thin film transistor array substrate, the color filter substrate including a plurality of black matrices, forming a plurality of black stripes on the color filter substrate, each of the plurality of black stripes corresponding to the black matrices, and forming a patterned retarder film on the color filter array substrate over the black stripes, wherein at least one of the plurality of black stripes includes a first black pattern and a second black pattern that are spaced apart from each other, such that gaps are disposed therebetween.

It is to be understood that both the foregoing general description and the following detailed description are examples and explanatory and are intended to provide further explanation of embodiments of the invention as claimed.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention. In the drawings.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Names of the respective elements used in the following explanations are selected only for convenience of writing the specification and may be thus different from those in actual products.

Figure 2:
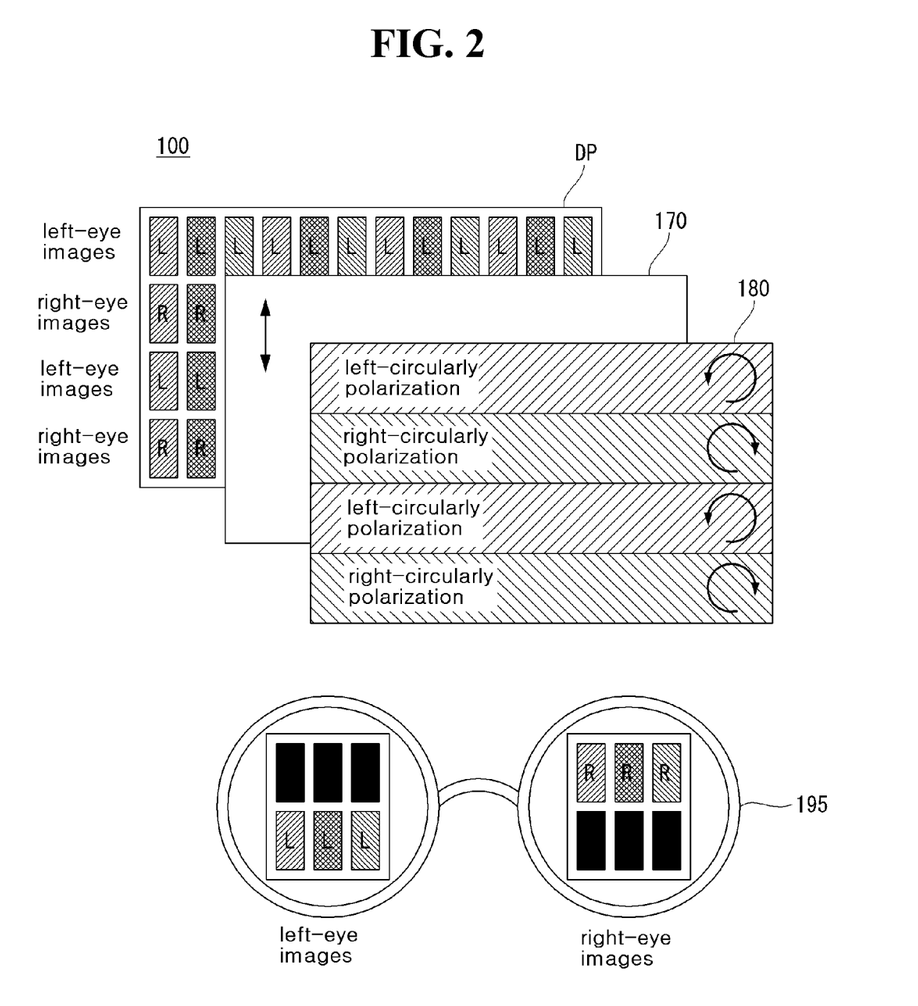
FIG. 2 is an example of a perspective exploded view showing a stereoscopic image display device according to an example embodiment.

FIG. 2 is an example of a perspective exploded view showing a stereoscopic image display device according to an example embodiment.

With reference to FIG. 2, the stereoscopic image display 100 according to an example embodiment may include a display panel DP, a polarization plate 170, a patterned retarder 180, and polarization glasses 195.

The display panel DP may be, but is not limited to, a liquid crystal display panel. The display panel DP may be a display panel for other flat display devices, such as a field emission display (FED), a plasma display panel (PDP), a light emitting diode device (LED), etc.

When the display panel DP is implemented as a liquid crystal display panel, the stereoscopic image display device 100 may further include a backlight unit (not shown) disposed under the display panel DP and a polarization plate (not shown) disposed between the display panel DP and the backlight unit. The patterned retarder 180 and the polarization glasses 195 are stereoscopic image driving elements, which realize a binocular parallax by spatially dividing left images and right images.

The display panel DP may include two glass substrates and a liquid crystal layer sandwiched therebetween. A thin film transistor array may be formed on the thin film transistor array substrate. A color filter array is formed on the color filter substrate. The color filter array may include black matrices, color filters, etc. The polarization plate 170 may be attached to the color filter substrate, and the polarization plate 170 may also be attached to the thin film transistor array substrate.

Left-eye images L and right-eye images R may be alternately displayed on the display panel DP in a line-by-line manner. The polarization plate 170 may be an analyzer attached onto the color filter substrate of the display panel DP, which may transmit only a specific linearly polarized light out of incident light passed through the liquid crystal layer of the display panel DP.

The patterned retarder 180 may include first retarder patterns and second retarder patterns which may be alternately disposed in a line-by-line manner. For example, the retarder patterns may be disposed in a line-by-line manner to make an angle of (+)45 degrees and (−)45 degrees with an absorption axis of the polarization plate 170.

Each of the retarder patterns may delay the phase of light by λ(wavelength)/4 using a birefringence medium. The optical axis of the first retarder patterns and the optical axis of the second retarder pattern may be orthogonal to each other.

Accordingly, the first retarder patterns may be disposed to face lines for displaying a left-eye image on the display panel DP, and may convert the light of the left-eye image into first polarized light (circularly polarized light or linearly polarized light). The second retarder patterns may be disposed to face lines for displaying a right-eye image on the display panel DP, and may convert the light of the right-eye image into second polarized light (circularly polarized light or linearly polarized light). In one example, the first retarder patterns may be implemented by a polarization filter for transmitting left-circularly polarized light, and the second retarder patterns may be implemented by a polarization filter for transmitting right-circularly polarized light.

A polarization film for allowing only the first polarization component to pass therethrough may be bonded to the left-eye of the polarization glasses 195, and a polarization film for allowing only the second polarization component to pass therethrough may be bonded to the right-eye of the polarization glasses 195. Therefore, a viewer wearing the polarization glasses 195 may see only a left-eye image with the left eye and only a right-eye image with the right eye, with an impression that an image displayed on the display panel DP is a stereoscopic image.

Hereinafter, a stereoscopic image display device and a method for manufacturing the same according to example embodiments will be described in more detail below. In what follows, the components common to those in the above-described stereoscopic image display are denoted by like reference numerals, so the descriptions thereof will be made briefly or omitted for conciseness.

Figure 3:
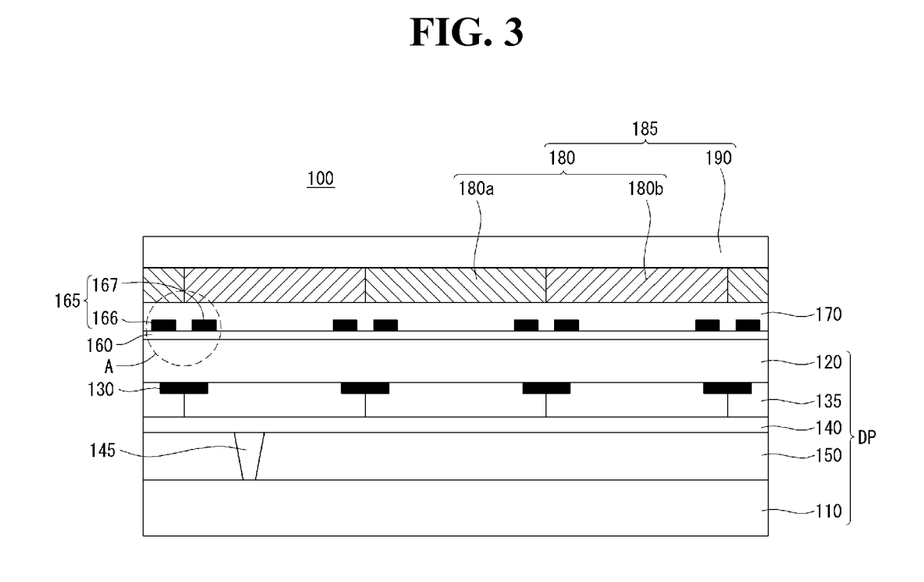
FIG. 3 is an example of a side view showing a stereoscopic image display device according to a first example embodiment.
Figure 4:
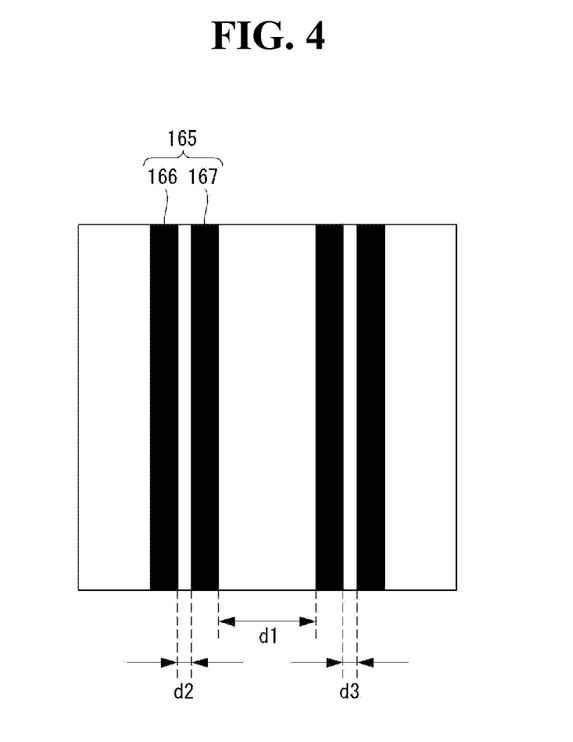
FIG. 4 is an example of a top plan view showing the stereoscopic image display device according to the first example embodiment.
Figure 5:
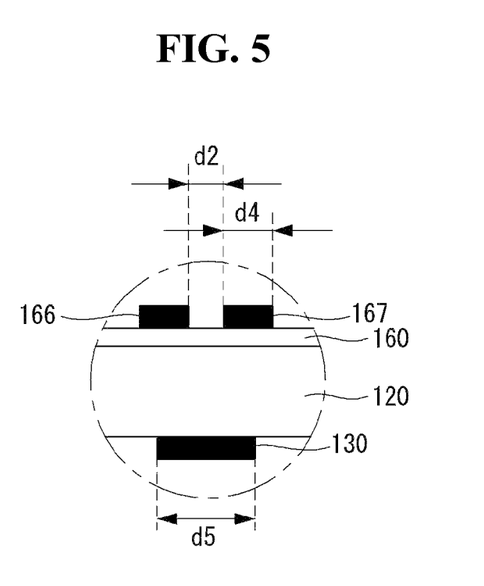
FIG. 5 is an example of an enlarged view of region A of FIG. 3.
Figure 6:
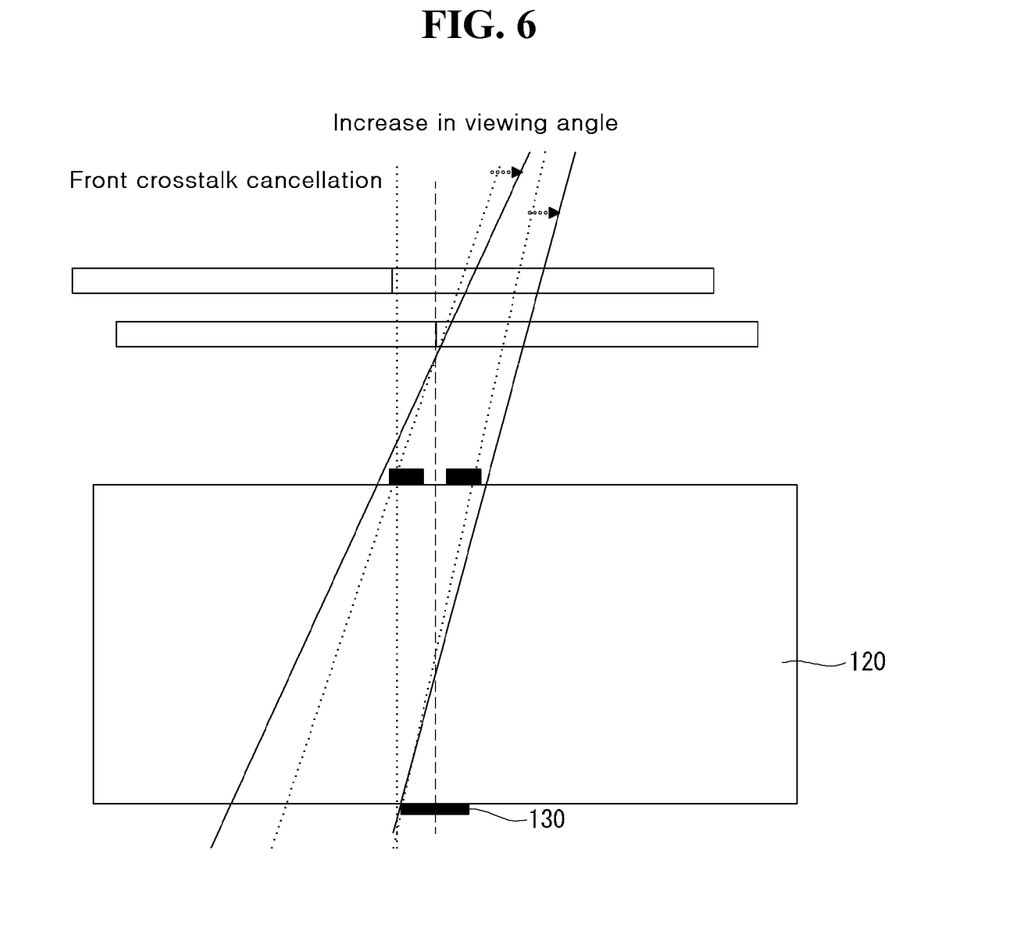
FIG. 6 is an example of a pattern diagram for explaining effects of the stereoscopic image display device according to the first example embodiment.
Figure 7:
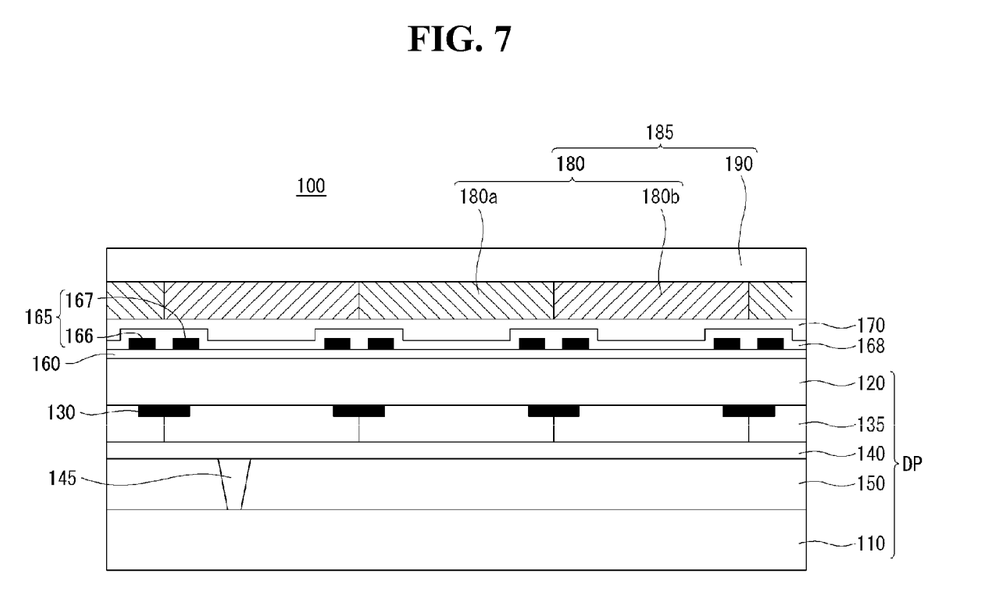
FIG. 7 is an example of a side view showing another stereoscopic image display device according to the first example embodiment.

FIG. 3 is an example of a side view showing a stereoscopic image display device according to a first example embodiment. FIG. 4 is an example of a top plan view showing the stereoscopic image display device according to the first example embodiment. FIG. 5 is an example of an enlarged view of region A of FIG. 3. FIG. 6 is an example of a pattern diagram for explaining effects of the stereoscopic image display device according to the first example embodiment. FIG. 7 is an example of a side view showing another stereoscopic image display device according to the first example embodiment.

With reference to FIG. 3, the stereoscopic image display device 100 according to the first example embodiment may include a display panel DP including a thin film transistor array substrate 110, a color filter substrate 120 facing the thin film transistors array substrate 110, and a liquid crystal layer 150 interposed therebetween.

For example, the thin film transistor array substrate 110 may have a thin film transistor array. The thin film transistor array may include a plurality of data lines supplied with red, green, and blue data voltages, a plurality of gate lines (or scan lines) which intersect the data lines and are sequentially supplied with gate pulses (scan pulses), a plurality of thin film transistors formed at the intersections of the data lines and the gate lines, a plurality of pixel electrodes for charging data voltages in liquid crystal cells, and a storage capacitor connected to the pixel electrodes to maintain the voltages of the liquid crystal cells.

Common electrodes facing the pixel electrodes to form an electric field may be disposed on the color filter substrate 120 in a vertical electric field driving type, such as a TN (twisted nematic) mode and a VA (vertical alignment) mode, and may be disposed on the thin film transistor array substrate 110 along with the pixel electrodes in a horizontal electric field type, such as an IPS (in plane switching) mode and an FFS (fringe field switching) mode.

The color filters 135 and a plurality of black matrices 130 disposed therebetween may be formed on the color filter substrate 120, and an overcoat layer 140 for protecting the color filters 135 and the black matrices 130 are formed thereon. The color filters 135 may function to convert light emitted from the backlight unit and transmitted through the liquid crystal layer 150 into red, green, and blue. Also, the color filters 135, with the black matrices 130 respectively disposed thereon, may function to separate a left-eye image and a right-eye image. The overcoat layer 140 may function to reduce a difference in level between the color filters 135 and protect the color filters 135.

In the thin film transistor array substrate 110 and the color filter substrate 120, alignment layers for setting a pre-tilt angle of liquid crystals may be respectively formed on the inner surfaces contacting the liquid crystal layer 150, and a column spacer 145 for keeping a cell gap of the liquid crystal cells may be formed.

A rear indium tin oxide (ITO) 160 may be formed on an outer side of the color filter substrate 120, black stripes may be formed on the rear ITO 160, the polarization plate 170 may be formed on the black stripes 165, and a patterned retarder film 185 may be formed on the polarization plate 170.

The rear ITO 160 may externally discharge static electricity generated on the color filter substrate 120, and may be formed on the entire surface of the color filter substrate 120. The first black stripes 165 corresponding to the black matrices 130 may be formed on the rear ITO 160. The above-mentioned polarization plate 170 may be formed on the first black stripes 165 to polarize the light transmitted through the display panel DP.

The patterned retarder film 185 may be positioned on the polarization plate 170. Of the patterned retarder film, as described above, the first retarder patterns 180a and the second retarder patterns 180b may be formed on the protective film 190. The first retarder patterns 180a may be disposed to face lines for displaying a left-eye image on the display panel DP, and may convert the light of the left-eye image into first polarized light (circularly polarized light or linearly polarized light). The second retarder patterns 180b may be disposed to face lines for displaying a right-eye image on the display panel DP, and may convert the light of the right-eye image into second polarized light (circularly polarized light or linearly polarized light). In one example, the first retarder patterns 180a may be implemented by a polarization filter for transmitting left-circularly polarized light, and the second retarder patterns 180b may be implemented by a polarization filter for transmitting right-circularly polarized light.

The plurality of black stripes 165 formed on the rear ITO 160 may be formed of the same material, such as carbon black, as the black matrices 130, and may be formed in regions corresponding to the black matrices 130. The plurality of black stripes 165 of embodiments each may include a first black pattern 166 and a second black pattern 167.

For example, as illustrated in FIGS. 4 and 5, at least one of the plurality of black stripes 165 may include a first black pattern 166 and a second black pattern 167 that may be spaced apart from each other. At least one of the gaps d1 between the black stripes 165 may be formed larger than the gaps d2 and d3 between the first black pattern 166 and the second black pattern 167.

The gaps d2 and d3 between the first black pattern 166 and the second black pattern 167 may be formed to overlap with the black matrices 130. The gaps d2 and d3 between the first black pattern 166 and the second black pattern 167 may cause light to be transmitted and emitted to the outside, preventing a decrease in aperture ratio.

As an example, the gaps d2 and d3 between the first black pattern 166 and the second black pattern 167 may range from 1 to 15 μm. If the gaps d2 and d3 between the first black pattern 166 and the second black pattern 167 are greater than or equal to 1 μm, this may provide less crosstalk on the front surface. Otherwise, if the gaps d2 and d3 between the first black pattern 166 and the second black pattern 167 are less than or equal to 15 μm, this may prevent a decrease in aperture ratio.

As the gaps d2 and d3 between the first black pattern 166 and the second black pattern 167 of the plurality of black stripes 165 may be made equal, the three-dimensional (3D) image quality of each region can be kept uniform. Moreover, the sum of the width d4 of the first black pattern 166 and the width d4 of the second black pattern 167 may be equal to the width d5 of the black matrices 130.

As shown in FIG. 6, if the width d5 of the black matrices 130 is equal to the sum of the width d4 of the first black pattern 166 and the width d4 of the second black pattern 167, the first black pattern 166 and second black pattern 167 spaced apart from each other can contribute to cancelling front crosstalk and to increasing vertical viewing angle. Moreover, light may transmit through the gaps between the first black pattern 166 and the second black pattern 167, which may prevent a decrease in aperture ratio.

Consequently, embodiments may reduce front crosstalk, may increase vertical viewing angle, and may prevent a decrease in aperture ratio by forming a plurality of black stripes including a first black pattern and a second black pattern, spaced apart from each other, in the regions corresponding to the black matrices.

As illustrated in FIG. 7, the stereoscopic image display device according to the second example embodiment may include an adhesive 168 formed between the rear ITO 160 with the black stripes 165 and the polarization plate 170 to bond the polarization plate 170.

Figure 8:
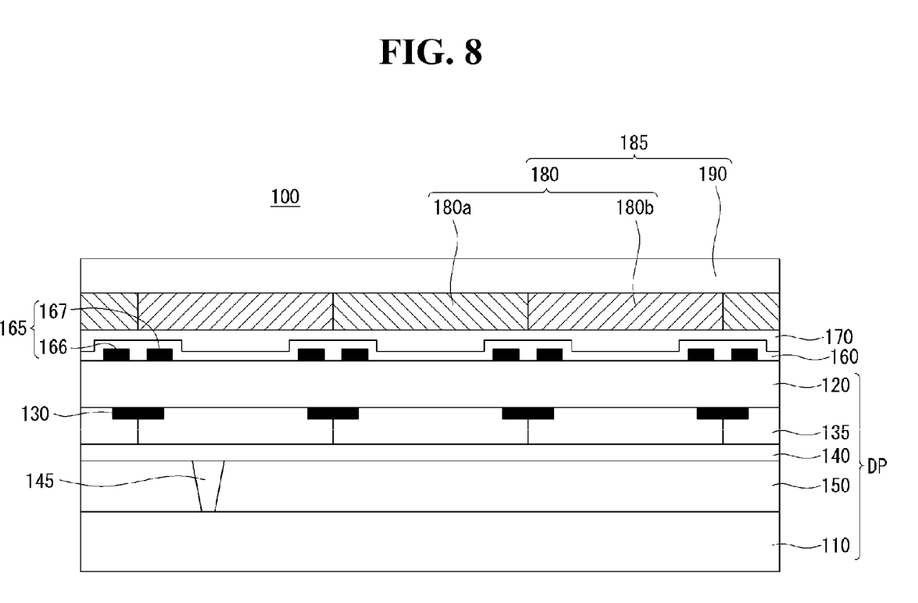
FIG. 8 is an example of a top plan view showing a stereoscopic image display device according to a second example embodiment.

FIG. 8 is an example of a top plan view showing a stereoscopic image display device according to a second example embodiment. Hereinafter, the same components as the above-described first example embodiment will be assigned the same reference numerals, and their explanations will be simplified.

With reference to FIG. 8, the stereoscopic image display device according to the second example embodiment may include a display panel DP including a thin film transistor array substrate 110, a color filter substrate 120 facing the thin film transistor array substrate 110, and a liquid crystal layer 150 interposed therebetween.

The color filters 135 and a plurality of black matrices 130 disposed therebetween may be formed on the color filter substrate 120, and an overcoat layer 140 for protecting the color filters 135 and the black matrices 130 may be formed thereon. In the thin film transistor array substrate 110 and the color filter substrate 120, alignment layers for setting a pre-tilt angle of liquid crystals may be respectively formed on the inner surfaces contacting the liquid crystal layer 150, and a column spacer 145 for keeping a cell gap of the liquid crystal cells may be formed.

In the second example embodiment, unlike the above-described first example embodiment, black stripes 165 may be formed on an outer side of the color filter substrate 120, and a rear ITO 160 may be formed to cover the black stripes 165. A polarization plate 170 may be formed on the rear ITO 160, and a patterned retarder film 185 may be positioned on the polarization plate 170. As described above, the patterned retarder film 185 may have first retarder patterns 180a and second retarder patterns 180b formed on a protective film 190. Also, the black stripes 165 formed on the top surface of the color filter substrate 120, i.e., under the rear ITO 160, may have the same configuration as the previous first example embodiment, so an explanation thereof will be omitted.

Hereinafter, example embodiments will be disclosed to help understanding of embodiments. However, the example embodiments are merely to explain the present invention, and not to limit the scope of the present invention.

EXAMPLE EMBODIMENT 1

A plurality of black matrices having a width of 50 μm may be formed on the bottom surface of a color filter substrate, first and second black patterns each having a width of 25 μm may be formed on the top surface of the color filter substrate, and the first black pattern and the second black pattern may be spaced apart from each other by a gap of 10 μm, forming a plurality of black stripes.

EXAMPLE EMBODIMENT 2

A plurality of black stripes may be formed by spacing the first black pattern and the second black pattern apart from each other by a gap of 15 μm under the same condition as the previous example embodiment 1.

COMPARATIVE EXAMPLE

In the related art given as a comparative example, a plurality of black stripes are formed, with the first black pattern and the second black pattern not spaced apart from each other, under the same condition as the previous example embodiment 1.

Figure 9:
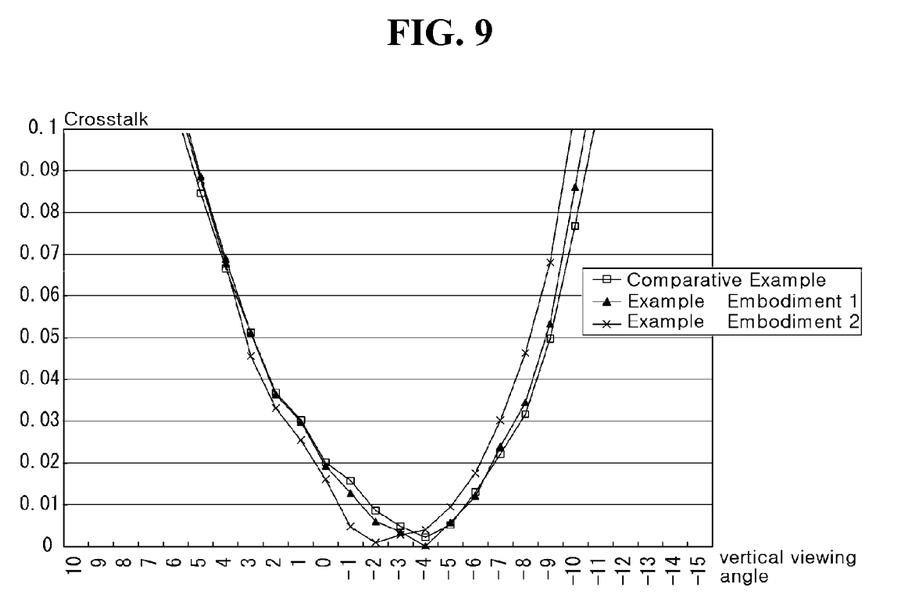
FIG. 9 is an example of a graph of the measurement of front crosstalk versus the vertical viewing angles of stereoscopic image display devices manufactured according to a comparative example and example embodiments.

Front crosstalk was measured relative to the vertical viewing angles of stereoscopic image display devices manufactured according to the comparative example, example embodiment 1, and example embodiment 2 as set forth above, and as shown in FIG. 9. It can be observed that front crosstalk decreases as the lowest point of each of the curves of the graph becomes closer to the horizontal axis, and the vertical viewing angle increases as the center of each curve becomes closer to 0 on the horizontal axis.

With reference to FIG. 9, example embodiments 1 and 2 showed less front crosstalk because the lowest points of the curves were closer to the horizontal axis than the comparative example. Example embodiment 2 showed improved vertical viewing angle compared to example embodiment 1 and to the comparative example 1.

As seen from FIG. 9, the stereoscopic image display device according to an example embodiment may reduce front crosstalk and improve vertical viewing angle and aperture ratio by further forming a plurality of black stripes including a first black pattern and a second black pattern spaced apart from each other.

It will be apparent to those skilled in the art that various modifications and variations can be made in the organic light emitting diode display device and method of driving the same of embodiments of the present invention without departing from the spirit or scope of the invention. Thus, it is intended that the present invention cover the modifications and variations of this invention provided they come within the scope of the appended claims and their equivalents.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A stereoscopic image display device, comprising:
a thin film transistor array substrate;
a color filter substrate facing the thin film transistor array substrate, the color filter substrate comprising a plurality of black matrices;
a plurality of black stripes on the color filter substrate, each of the plurality of black stripes corresponding to the black matrices;
a patterned retarder film on the color filter array substrate over the black stripes; and
an adhesive layer between the black stripes and the patterned retarder film,
wherein at least one of the plurality of black stripes comprises a first black pattern and a second black pattern that are spaced apart from each other, such that gaps are disposed therebetween over the black matrices, and
wherein the adhesive is disposed:
in the gaps between the first and second black patterns, and
between adjacent black stripes.

2. The device of claim 1, wherein the gaps between the first black pattern and the second black pattern overlap respective black matrices.

3. The device of claim 1, wherein a width of each of the gaps between the first black pattern and the second black pattern ranges from 1 to 15 μm.

4. The device of claim 1, wherein the gaps between the first black pattern and the second black pattern of the plurality of black stripes are equal in width.

5. The device of claim 1, wherein the sum of the width of the first black pattern and the width of the second black pattern is equal to a width of one of the black matrices.

6. The device of claim 1, wherein the width of at least one of the gaps of the black stripes is greater than the width of one of the gaps between the first black pattern and the second black pattern.

7. The device of claim 1, further comprising a polarization plate between the black stripes and the adhesive layer.

8. The device of claim 1, further comprising a rear indium tin oxide (ITO) on the bottom or top surface of the black stripes.

9. A method of manufacturing a stereoscopic image display device, the method comprising:
forming a thin film transistor array substrate;
forming a color filter substrate facing the thin film transistor array substrate, the color filter substrate comprising a plurality of black matrices;

forming a plurality of black stripes on the color filter substrate, each of the plurality of black stripes corresponding to the black matrices;

forming a patterned retarder film on the color filter array substrate over the black stripes; and forming an adhesive layer between the black stripes and the patterned retarder film, wherein at least one of the plurality of black stripes comprises a first black pattern and a second black pattern that are spaced apart from each other, such that gaps are disposed therebetween over the black matrices, and wherein the adhesive is disposed:

in the gaps between the first and second black patterns, and between adjacent black stripes.

10. The method of claim 9, wherein the gaps between the first black pattern and the second black pattern overlap respective black matrices.

11. The method of claim 9, wherein a width of each of the gaps between the first black pattern and the second black pattern ranges from 1 to 15 μm.

12. The method of claim 9, wherein the gaps between the first black pattern and the second black pattern of the plurality of black stripes are equal in width.

13. The method of claim 9, wherein the sum of the width of the first black pattern and the width of the second black pattern is equal to a width of one of the black matrices.

14. The method of claim 9, wherein the width of at least one of the gaps of the black stripes is greater than the width of one of the gaps between the first black pattern and the second black pattern.

15. The method of claim 9, further comprising forming a polarization plate between the black stripes and the adhesive layer.

16. The method of claim 9, further comprising forming a rear indium tin oxide (ITO) on the bottom or top surface of the black stripes.

* * * * *